US008928377B2

(12) United States Patent
Qureshi

(10) Patent No.: US 8,928,377 B2
(45) Date of Patent: Jan. 6, 2015

(54) SCANNABLE FAST DYNAMIC REGISTER

(71) Applicant: VIA Technologies, Inc., New Taipei (TW)

(72) Inventor: Imran Qureshi, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 13/951,295

(22) Filed: Jul. 25, 2013

(65) Prior Publication Data

US 2014/0320188 A1    Oct. 30, 2014

Related U.S. Application Data

(60) Provisional application No. 61/815,642, filed on Apr. 24, 2013.

(51) Int. Cl.
*H03K 3/00* (2006.01)
*H03K 3/356* (2006.01)

(52) U.S. Cl.
CPC .............................. *H03K 3/356104* (2013.01)
USPC ............. 327/199; 327/200; 327/202; 326/93; 326/94; 326/98

(58) Field of Classification Search
CPC ........... G11C 2029/3203; G11C 29/32; H03K 3/3562; H03K 3/35625; H03K 3/012
USPC ................. 327/199, 201, 202; 326/93, 94, 98
See application file for complete search history.

(56) References Cited

U.S. PATENT DOCUMENTS

| | | | |
|---|---|---|---|
| 4,849,658 A | 7/1989 | Iwamura et al. | |
| 5,075,386 A | 12/1991 | Vanderbilt | |
| 5,880,608 A | 3/1999 | Mehta et al. | |
| 5,889,979 A | 3/1999 | Miller, Jr. et al. | |
| 5,926,038 A | 7/1999 | Fouts et al. | |
| 5,973,531 A * | 10/1999 | Kim et al. | 327/227 |
| 6,060,910 A | 5/2000 | Inui | |
| 6,172,532 B1 | 1/2001 | Nishio et al. | |
| 6,191,618 B1 | 2/2001 | Gayles et al. | |
| 6,265,899 B1 | 7/2001 | Abdel-Hafeez et al. | |
| 6,420,904 B1 | 7/2002 | Dutta et al. | |
| 6,429,689 B1 | 8/2002 | Allen et al. | |
| 6,486,706 B2 | 11/2002 | Ye et al. | |
| 6,496,038 B1 | 12/2002 | Sprague et al. | |
| 6,560,737 B1 | 5/2003 | Colon-Bonet et al. | |
| 6,628,143 B2 | 9/2003 | Hsu et al. | |
| 6,650,145 B2 | 11/2003 | Ngo et al. | |

(Continued)

*Primary Examiner* — John Poos
(74) *Attorney, Agent, or Firm* — Gary Stanford; James W. Huffman

(57) ABSTRACT

A scannable fast dynamic register including a data and scan enable circuit, a precharge circuit, a select circuit, a store circuit, and a scan input enable circuit. The data and scan enable circuit pulls a first precharge node to a discharge node in response to the clock upon evaluation in normal mode. The precharge circuit precharges first and second precharge nodes high, in which one of the precharged nodes discharges depending upon whether a data block evaluates. The store circuit and an output gate are responsive to the second precharge node to provide the output. The select circuit is interposed before the store circuit to allow injection of scan data in a scan mode. In scan mode, the scan input enable circuit provides scan data to the select and store circuits. The scan input enable circuit also includes a store circuit which operates with the first store circuit in a master-slave configuration.

19 Claims, 4 Drawing Sheets

(56) References Cited

U.S. PATENT DOCUMENTS

| | | |
|---|---|---|
| 6,828,827 B2 | 12/2004 | Azam et al. |
| 6,956,406 B2 | 10/2005 | Seningen et al. |
| 6,960,939 B2 | 11/2005 | Ngo |
| 6,963,228 B2 | 11/2005 | Azam |
| 7,064,584 B2 | 6/2006 | Bertram et al. |
| 7,129,754 B2 | 10/2006 | Ngo et al. |
| 7,157,930 B2 | 1/2007 | Hirata |
| 7,161,992 B2 | 1/2007 | Anders et al. |
| 7,187,209 B2 | 3/2007 | Bertram |
| 7,187,210 B2 | 3/2007 | Lundberg et al. |
| 7,187,211 B2 | 3/2007 | Lundberg et al. |
| 7,193,445 B2 | 3/2007 | Bertram |
| 7,224,190 B2 | 5/2007 | Haller et al. |
| 7,317,339 B1 | 1/2008 | Qureshi et al. |
| 7,321,243 B1 | 1/2008 | Qureshi et al. |
| 7,332,938 B2 | 2/2008 | Al-Assadi et al. |
| 7,336,105 B2 | 2/2008 | Chuang et al. |
| 7,348,806 B2 | 3/2008 | Lundberg et al. |
| 7,382,161 B2 | 6/2008 | Lundberg et al. |
| 7,414,436 B1 | 8/2008 | Klim et al. |
| 7,417,465 B2 | 8/2008 | Lundberg et al. |
| 7,429,880 B2 | 9/2008 | Rana et al. |
| 7,492,203 B2 | 2/2009 | Kim |
| 7,501,850 B1 | 3/2009 | Correale, Jr. et al. |
| 7,557,616 B2 | 7/2009 | Klim et al. |
| 7,649,395 B2 * | 1/2010 | Ahmadi .................. 327/202 |
| 7,663,408 B2 | 2/2010 | Masleid et al. |
| 7,710,155 B2 | 5/2010 | Bhatia et al. |
| 7,990,180 B2 | 8/2011 | Lundberg et al. |
| 7,994,823 B2 * | 8/2011 | Lee et al. ................ 326/96 |
| 8,493,119 B2 * | 7/2013 | Leach et al. ............. 327/202 |
| 2002/0158670 A1 | 10/2002 | Alvandpour |
| 2003/0042932 A1 | 3/2003 | Bales |
| 2003/0052714 A1 | 3/2003 | Alvandpour |
| 2003/0110404 A1 | 6/2003 | Seningen et al. |
| 2004/0051560 A1 | 3/2004 | Belluomini et al. |
| 2004/0113658 A1 | 6/2004 | Lundberg |
| 2005/0046446 A1 | 3/2005 | Qureshi et al. |
| 2005/0110522 A1 | 5/2005 | Hoekstra |
| 2006/0158226 A1 | 7/2006 | Bertram |
| 2009/0108874 A1 | 4/2009 | Klim et al. |
| 2009/0108875 A1 | 4/2009 | Klim et al. |
| 2014/0049289 A1 | 2/2014 | Chang et al. |

* cited by examiner

SCANNABLE FAST DYNAMIC REGISTER

CROSS REFERENCE TO RELATED APPLICATION(S)

This application claims priority to the following U.S. Provisional Patent Application which is hereby incorporated by reference in its entirety for all intents and purposes.

| SER. NO. | FILING DATE | TITLE |
|---|---|---|
| 61/815,642 | Apr. 24, 2013 | SCANNABLE FAST DYNAMIC REGISTER |

This application is related to the following co-pending U.S. Patent Applications, each of which has a common assignee and a common inventor.

| SER. NO. | FILING DATE | TITLE |
|---|---|---|
| 13/951,306 | Jul. 25, 2013 | FAST DYNAMIC REGISTER WITH TRANSPARENT LATCH |

BACKGROUND OF THE INVENTION

1. Field of the Invention

The present invention relates to latch and register circuits, and more particularly to a scannable fast dynamic register.

2. Description of the Related Art

Dynamic logic circuits often exhibit relatively long setup and/or hold times to ensure proper operation. A fast dynamic register circuit with minimal setup times without the overhead of pulsed clock circuits is needed with scan capability.

SUMMARY OF THE INVENTION

A scannable fast dynamic register according to one embodiment includes a data and scan enable circuit, a precharge circuit, a select circuit, a store circuit, a scan input enable circuit, and an output logic gate. The data and scan enable circuit is coupled between a first precharge node and a discharge node and receives at least one data input and a scan enable input, and operates to pull the first precharge node to the discharge node when a clock node transitions from a first clock state to a second clock state and either when the data block evaluates or when the scan enable input is asserted. Otherwise, the data and scan enable circuit does not pull the first precharge node to the discharge node. The precharge circuit precharges first and second precharge nodes high while the clock node is in the first clock state, releases the first precharge node and pulls the discharge node low when the clock node transitions to the second clock state, and discharges the second precharge node low when the first precharge node remains high after the clock node transitions to the second clock state.

The select circuit has a first input coupled to the second precharge node, has a second input coupled to a scan data node, and has a select output. The store circuit has a store input receiving the select output and has an output coupled to a store node. The store circuit passes a state of the select output to the store node while the clock node is in the second clock state, and holds a last state of the store node when the clock node is in the first clock state. The scan input enable circuit passes a state of a scan input to the scan data node when the scan enable input is asserted and when the clock node is in the first clock state, forces the scan data node high when the scan enable signal is de-asserted and when the clock node is in the first clock state, and holds a last state of the scan data node when the clock node is at the second clock state. The output logic gate drives an output node to a state based on states of the second precharge node and the store node.

The data and scan enable circuit may include a data block and a second enable circuit. In a normal mode, the data block either evaluates to pull the first precharge node low in response to a transition of the clock node, or otherwise does not evaluate. The scan enable circuit is coupled in parallel with the data block to effectively bypass the data block when in a scan mode. The data block includes one or more transistors configured to perform a predetermined logic function.

The select circuit may be implemented as an AND-type logic gate, and the store circuit may be implemented as a transparent latch or the like. The scan input enable circuit may include scan enable logic responsive to the scan enable input and the scan input, and may further include another store circuit. In one embodiment during scan mode, the store circuits operate as master-slave. The second store circuit may also be a transparent latch.

An integrated circuit according to one embodiment includes a clock node and a scan enable node, in which the scan enable node receives a scan enable signal indicative of a scan mode, and at least one scannable fast dynamic register. Each scannable fast dynamic register may be configured in similar manner described above. The integrated circuit may further include a scan in node and a scan out node and multiple scannable fast dynamic registers may be included. A scan input of a first register is coupled to the scan in node. A scan input of a last register is coupled to an output node of a previous register, and an output node of the last register is coupled to the scan out node. At least one combinatorial logic block may be included between the registers.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
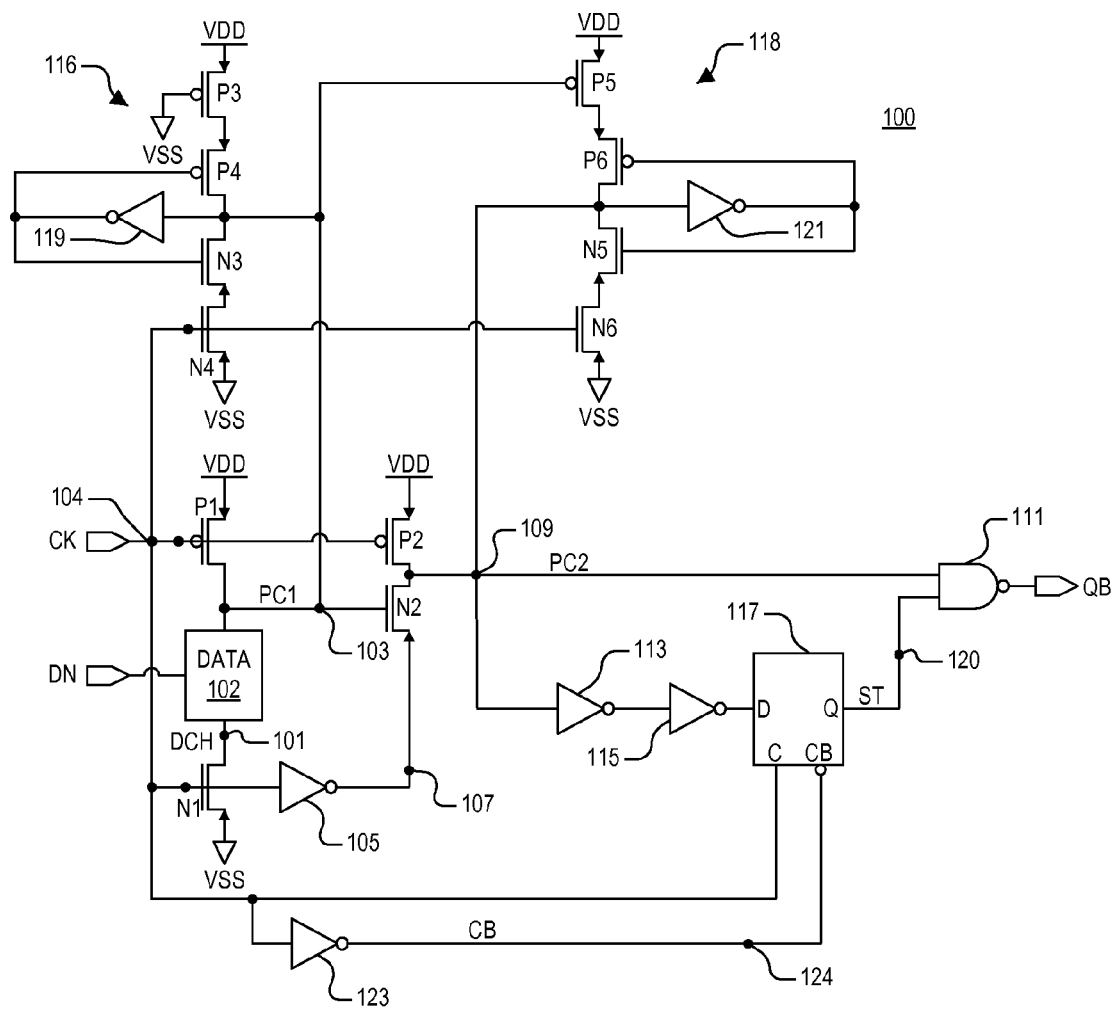
FIG. 1 is a schematic diagram of a fast dynamic register implemented according to one embodiment.

FIG. 1 is a schematic diagram of a fast dynamic register 100 implemented according to one embodiment. One or more data inputs, collectively denoted DN, are provided to respective inputs of an input data block 102. The notation "DN" denotes any suitable integer number "N" of one or more data inputs, in which N is an integer greater than 0. A single input data value (e.g., D, or D1) is also contemplated. The input data block 102 is coupled between a precharge (PC1) node 103 and an discharge (DCH) node 101. The input data block 102 is configured according to a desired logic function to evaluate the collective state of the one or more data inputs DN when CK goes high. If the data block 102 "evaluates" when CK goes high, then it creates a current path between nodes 103 and 101 having a sufficiently low resistance to effectively pull the voltage of PC1 down towards VSS via the DCH node. If the data block 102 does not evaluate, then the current path is not provided or otherwise presents a high impedance path between the nodes 103 and 101 so that node PC1 103 remains high. At least one reason that the fast dynamic register 100 is fast is because it has close-to-zero setup requirement for non-scan data inputs.

An N-channel transistor N1 has its drain coupled to the DCH node 101, its source coupled to a power supply node VSS, and its gate coupled to a clock node 104 receiving an input clock signal CK. The clock node 104 is coupled to the gates of N-channel transistors N1, N4, and N6, to the gates of P-channel devices P1 and P2, to the inputs of inverters 105 and 123, and to the non-inverting clock input "C" of a latch 117. P1 and P2 have their sources coupled to a power supply node VDD. The drain of P1 is coupled to the PC1 node 103 and the drain of P2 is coupled to a second precharge (PC2) node 109. The output of the inverter 105 is coupled to a node 107, which is coupled to the source of an N-channel transistor N2. N2 has is gate coupled to the PC1 node 103 and its drain coupled to the PC2 node 109.

The PC2 node 109 is coupled to one input of a two-input NAND gate 111, having its output providing the inverted data output QB. It is noted that in an alternative embodiment, the NAND gate 111 may be replaced by an AND gate (for a non-inverted output) depending upon the particular implementation. The PC2 node 109 is coupled to the input of another inverter 113, having its output coupled to the input of an inverter 115, having its output coupled to the data "D" input of the latch 117. The output of the inverter 123 provides an inverted clock signal on a node CB 124 which is coupled to the inverted clock input "CB" of the latch 117, which has its output coupled to a store node 120 providing a signal ST. The store node 120 is coupled to the other input of the NAND gate 111.

The PC1 node 103 is coupled to a keeper circuit 116, which includes P-channel devices P3 and P4, N-channel transistors N3 and N4, and an inverter 119. The source of P3 is coupled to VDD, its gate is coupled to VSS and its drain is coupled to the source of P4. The drain of P4 is coupled to the PC1 node 103, which is further coupled to the input of the inverter 119 and to the drain of N3. The source of N3 is coupled to the drain of N4, having its source coupled to VSS. The output of the inverter 119 is coupled to the gates of N3 and P4.

The PC2 node 109 is further coupled to a keeper circuit 118, which includes P-channel devices P5 and P6, N-channel transistors N5 and N6, and an inverter 121. The source of P5 is coupled to VDD, its gate is coupled to the PC1 node 103, and its drain is coupled to the source of P6. The drain of P6 is coupled to the PC2 node 109, which is further coupled to the input of the inverter 121 and to the drain of N5. The source of N5 is coupled to the drain of N6, having its source coupled to VSS and its gate coupled to the CK node 104. The output of the inverter 121 is coupled to the gates of N5 and P6.

It is noted that N-channel and P-channel devices described herein are shown as MOS type devices or field-effect transistors (FETs) or MOSFETs or the like, such as NMOS, PMOS, NFET, PFET, etc., type transistor devices. In general, each transistor device includes first and second current terminals (e.g., drain, source, emitter, collector, etc.) and a control node (e.g., gate, base, etc.). Any logic gates described herein, including inverters and logic gates (AND, NAND, OR, NOR, etc.), and any latches described herein, may also be implemented with N-channel and P-channel devices or transistors or the like.

In one embodiment, the latch 117 is configured as a transparent latch including pass gates or the like in which the D input is passed to the Q output when the C input is high and CB input is low, and in which the Q output is isolated from the D input when the C input is low and the CB input is high. The power supply node VSS has a suitable reference voltage (e.g., ground) relative to another power supply node VDD. The power supply voltage between VDD and VSS is any suitable voltage level depending upon the particular architecture or technology employed (e.g., 1V, 1.5V, 3V, 5V, etc.).

The clock signal CK generated on the CK node 104 may be generated locally (e.g., local oscillator or the like, not shown) or provided from an external source. The CK signal is asserted in a positive-logic sense in which it provides a set-up time when low and a hold time when high for data evaluation. Thus, the operative clock edge is the rising clock edge. The present disclosure contemplates a negative-logic clock signal as well. In general, the clock signal toggles between first and second states for purposes of timing and synchronization or the like.

During normal operation, when CK is asserted low, the precharge nodes PC1 103 and PC2 109 are both precharged high to VDD via P1 and P2, respectively. N4 and N6 of the keeper circuits 116 and 118, respectively, are turned off. P3 and P4 of the keeper circuit 116 are on keeping the PC1 node 103 high. N1 is turned off and the inverter 105 pulls node 107 high so that N2 is off.

The data inputs DN generally change or otherwise transition while CK is low. Assuming that the data signals DN do not cause the data block 102 to evaluate when CK goes high, P1 and P2 are turned off and N4, N6 and N1 are turned on. The PC1 node 103 remains pulled high by the keeper circuit 116 (via P3 and P4), and the inverter 105 pulls node 107 low, so that N2 is turned on to discharge the PC2 node 109 low. The NAND gate 111 pulls QB high (or otherwise keeps QB high) in response to PC2 going low. The inverters 113 and 115 pull the D input of the latch 117 low after a small delay. Since CK is high and CB is pulled low by the inverter 123, the latch 117 is in its transparent state so that the low state of its D input is passed to pull the store node 120 low (or otherwise keep ST low). N5 and N6 of the keeper circuit 118 are on and keep the PC2 node 109 low until CK goes low.

When CK goes back low, the latch 117 switches to its isolation state to keep the store node 120 low. In this manner, the NAND gate 111 keeps QB pulled high regardless of any change of state of the PC2 node 109. N4 and N6 are turned off and P1 and P2 are turned on by CK, so that PC1 and PC2 are both precharged high again. The QB output signal is latched high, and the fast dynamic register 100 is ready for another data evaluation in the next CK cycle.

In the next cycle, it is assumed that the data inputs DN change so that the data block 102 evaluates. When CK goes back high, P1 is turned off, N1 is turned on and the data block 102 evaluates to pull the PC1 node 103 low. The devices within the data block 102 and N1 are sufficiently sized to overcome P3 and P4. As the PC1 node 103 is pulled low, N3 and N4 are turned on to keep PC1 low. PC1 going low turns P5 on to keep the PC2 node 109 pulled high via P5 and P6. It is noted that since node 107 is pulled low and that the PC1 node 103 is pulled low, N2 may turn slightly on momentarily. However, P5 and P6 keep the PC2 node 109 high.

While CK is high, the latch 117 is transparent so that the high value of the PC2 node 109 is passed to the store node 120, so that both inputs of the NAND gate 111 are high pulling QB low. When CK next goes low, the store node 120 at the output of the latch 117 is latched high until the next CK cycle.

P1, P2, N1, N2, the inverter 105 (and the keeper circuits 116 and 118) collectively operate as a precharge circuit in response to CK. When CK is low, the precharge circuit precharges both nodes 103 and 109 high. When CK goes high, one of the nodes 103 and 109 goes low depending upon whether the input data block 102 evaluates.

Figure 2:
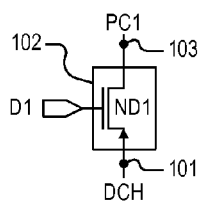
FIGS. 2-5 illustrate different configurations of the data block of FIG. 1 including a one or more N-channel transistors.

FIGS. 2-5 illustrate different configurations of the data block 102 for performing a desired logic function. FIG. 2 illustrates a simple configuration in which the data block 102 includes a single N-channel transistor ND1 having its drain coupled to the PC1 node 103, its source coupled to the DCH node 101, and its gate receiving a single data input D 1. In this case, the data block 102 evaluates when D1 is high since ND1 is turned on when CK goes high. The data block 102 does not evaluate when D1 is low since ND1 remains off so that the PC 1 node 103 remains high when CK goes high.

Figure 3:
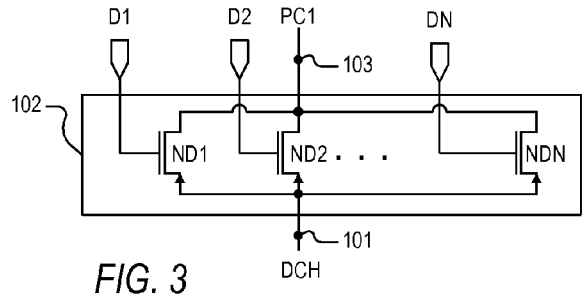

FIG. 3 is a schematic diagram of an alternative embodiment of the data block 102 including a number N of N-channel transistors ND1, ND2, . . . , NDN (ND1-NDN) coupled in parallel. In particular, each of the N-channel transistors ND1-NDN has its source coupled to the DCH node 101, its drain coupled to the PC1 node 103, and its gate receiving a corresponding one of N data inputs D1, D2, . . . , DN (D1-DN). In this case, the data block 102 evaluates when any of the of the data inputs D1-DN is high (such as according to the logic OR function).

Figure 4:
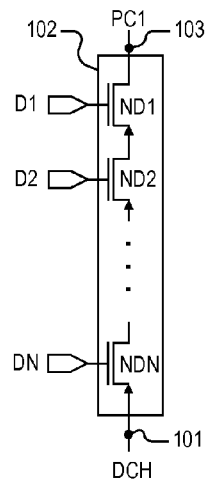

FIG. 4 is a schematic diagram of an alternative embodiment of the data block 102 including a number N of N-channel transistors ND1, ND2, . . . , NDN (ND1-NDN) coupled in series. In particular, a first N-channel transistor ND1 has its drain coupled to the PC1 node 103, a second N-channel transistor ND2 has its drain coupled to the source of ND1, and so on up to a last N-channel transistor NDN having it source coupled to the DCH node 101. The gates of the N-channel transistors ND1-NDN receive a corresponding one of the N data inputs D1, D2, . . . , DN (D1-DN). In this case, the data block 102 evaluates only when each of the of the data inputs D1-DN is high (such as according to the logic AND function).

Figure 5:
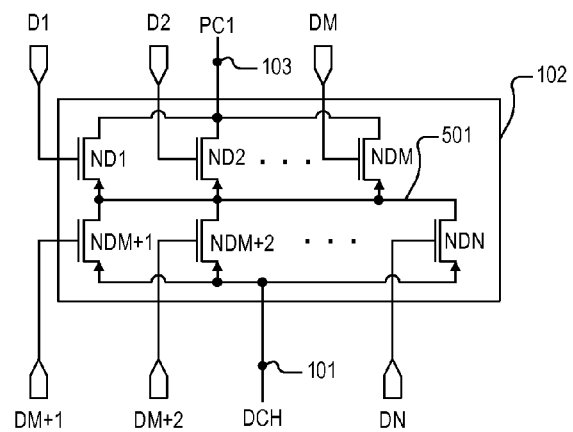

FIG. 5 is a schematic diagram of an alternative embodiment of the data block 102 including a number N of N-channel transistors ND1, ND2, . . . , NDN (ND1-NDN) coupled in any suitable series- and parallel-coupled combination. In this case, a first set of M devices ND1-NDM are coupled in parallel with each other between the PC1 node 103 and an intermediate node 501, and the remaining devices NDM+1, NDM+2, . . . , NDN are coupled in parallel between the intermediate node 501 and the DCH node 101. Again, the gates of the N-channel transistors ND1-NDN receive a corresponding one of the N data inputs D1, D2, . . . , DN (D1-DN). In this case, the data block 102 evaluates only when one of the of the data inputs D1-DM is high and one of the data inputs DM+1-DN is high (such as according to a logic OR-AND function). It is contemplated that additional layers may be added with corresponding additional intermediate nodes with any suitable number of devices coupled in parallel in each layer.

Figure 6:
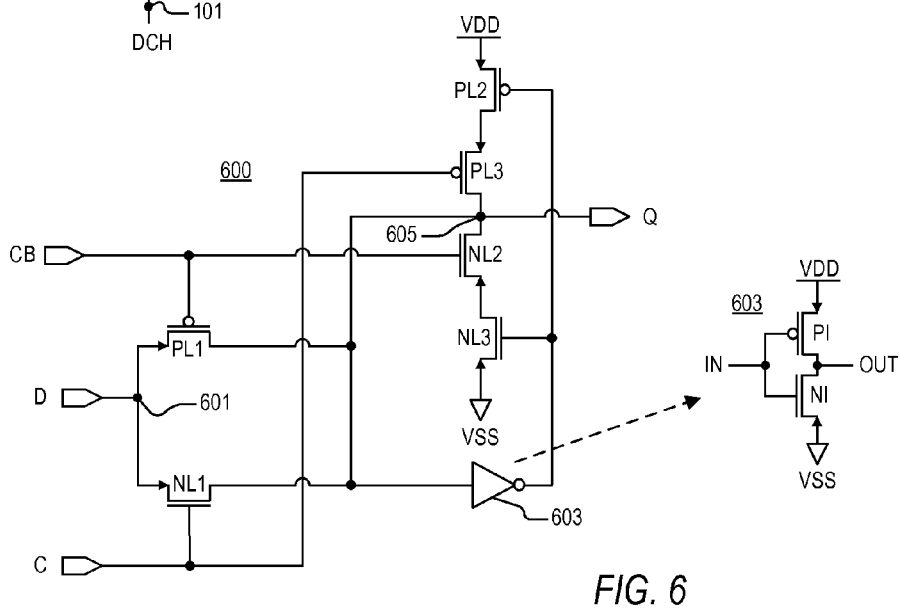
FIG. 6 is a schematic diagram of a latch according to one embodiment which may be used as the latch of FIG. 1.

FIG. 6 is a schematic diagram of a latch 600 according to one embodiment which may be used as the latch 117. In this case, the latch 600 includes N-channel transistors NL1, NL2 and NL3, P-channel devices PL1, PL2 and PL3, and an inverter 603. The non-inverted clock C is provided to the gates of NL1 and PL3 and the inverted clock CB is provided to the gates of PL1 and NL2. The data input D is provided to an input node 601, which is further coupled to the sources of NL1 and PL1. The drains of NL1 and PL1 are coupled together at an output node 605 providing output signal Q. PL2, PL3, NL2 and NL3 are coupled into a stack configuration implementing a keeper circuit. In particular, PL2 has its source coupled to VDD, its drain coupled to the source of PL3, which has its drain coupled to the drain of NL2 at the output node 605. The source of NL2 is coupled to the drain of NL3, which has its source coupled to VSS. Node 605 is coupled to the input of the inverter 603, which has its output coupled to the gates of NL3 and PL2.

In operation, when C is high and CB is low, the latch 600 is in its transparent state. In the transparent state, PL3 and NL2 remain or are otherwise turned off to isolate the Q output node 605 from operation of the keeper. Further, PL1 and NL1 are both turned on to provide a low impedance path from the input node 601 to the output node 605, so that output Q is driven to the state of input D. When C is low and CB is high, the latch 600 is in its isolation state in which PL1 and NL1 are turned off to isolate Q from D. If Q is low, then NL2 and NL3 are both turned on to keep Q latched low. If Q is high, then PL2 and PL3 are both turned on to keep Q latched high. When used as the latch 117, CK is provided to clock input C, CB is provided to clock input CB, the output of the inverter 115 is provided to the data input D, and output Q drives the store node 120.

The latch 600 may be implemented in an efficient manner using smaller devices to consume less space and power. NL1 and PL1 are sufficiently sized (e.g., larger) to ensure fast transitions between the D input and the Q output. However, in one embodiment, the remaining devices PL2, PL3, NL2, NL2 and the devices of the inverter 603 are made very small because they are only performing a keeper operation. As shown pointed by dashed arrow, the inverter 603 is configured as a P-channel device PI coupled in series with an N-channel transistor NI, having their gates coupled together at input IN and their drains coupled together at output OUT. In one embodiment, the devices PI and NI are very small devices to consume less space and power. The inverters 105, 123, 113 and 115 may be made in similar manner, but using larger devices for faster switching operation. NL1 and PL1 perform the primary switching operation driven by an external gate (e.g., the output of the inverter 115), whereas the devices PL2 and PL3 or NL2 and NL3 switch in response to switching of inverter 603 to maintain the state of Q after switching.

Consider a first case when transitioning QB from low to high. In this case, when CK is low, ST is latched high from a prior cycle, PC2 is precharged high and QB is initially low. In this case, when CK goes high and the data block 102 fails to evaluate, the delay includes the delay of the inverter 105 pulling node 107 low turning N2 on to pull PC2 low, and then delay of the NAND gate 111 responsively asserting its output high. The store node 120 goes low after delay through the inverters 113 and 115 and the latch 117 to keep QB high. The inverter 113 may be sized small to minimize loading on the PC2 node 109. Once the store node 120 goes low, CK may transition back low to initiate the next cycle.

Consider a second case when transitioning QB from high to low. Continuing from the first case, ST is latched low from the prior cycle, so that QB is initially high. When CK goes back low, the PC2 node 109 is precharged high once again. As the data input(s) change while CK is low, the inverters 113 and 115 transition so that the data input D of the latch 117 is high. If the data block 102 evaluates in the next cycle upon the next high assertion of CK, the PC2 node 109 stays high while the latch 117 becomes transparent so that the inverter 115 asserts the store node 120 through the latch 117. In response to ST going high, the NAND gate 111 pulls QB low.

The first case is approximately a 2.5 gate delay from CK going high to QB going high. Since the gate of N2 is already precharged high, as the output of the inverter 105 is going low in response to the CK transition, the PC2 node 109 is pulled low at the same time, which is sensed by the NAND gate 111.

For the second case, with reference to the latch 600 shown in FIG. 6, the D input is already high when CK transitions high. As CK goes high pulling the C input high, NL1 is turned on to initiate pulling the Q output high thus pulling the store node 120 high. The NAND gate 111 responsively pulls QB low which appears to be only a 2 gate delay. It is noted, however, that NL1 may be insufficient by itself to pull the store node 120 fully high. As CK goes high, CB goes low with a 1-gate delay through the inverter 123. CB going low turns on PL1 to complete the transition of the Q output going high to pull the store node 120 fully high. Although this appears to be a 3-gate delay, the combination of NL1 and PL1 of the latch 600 used as the latch 117 causes a transition of QB faster than a 3-gate delay. Thus, the overall delay is also approximately 2.5 gate delays from CK going high to QB going low. For this second case, the configuration and placement of latch 117 as close as possible to final NAND gate 111 serves to minimize the delay of the second case, thus preventing this delay from being the critical delay of the circuit.

Figure 7:
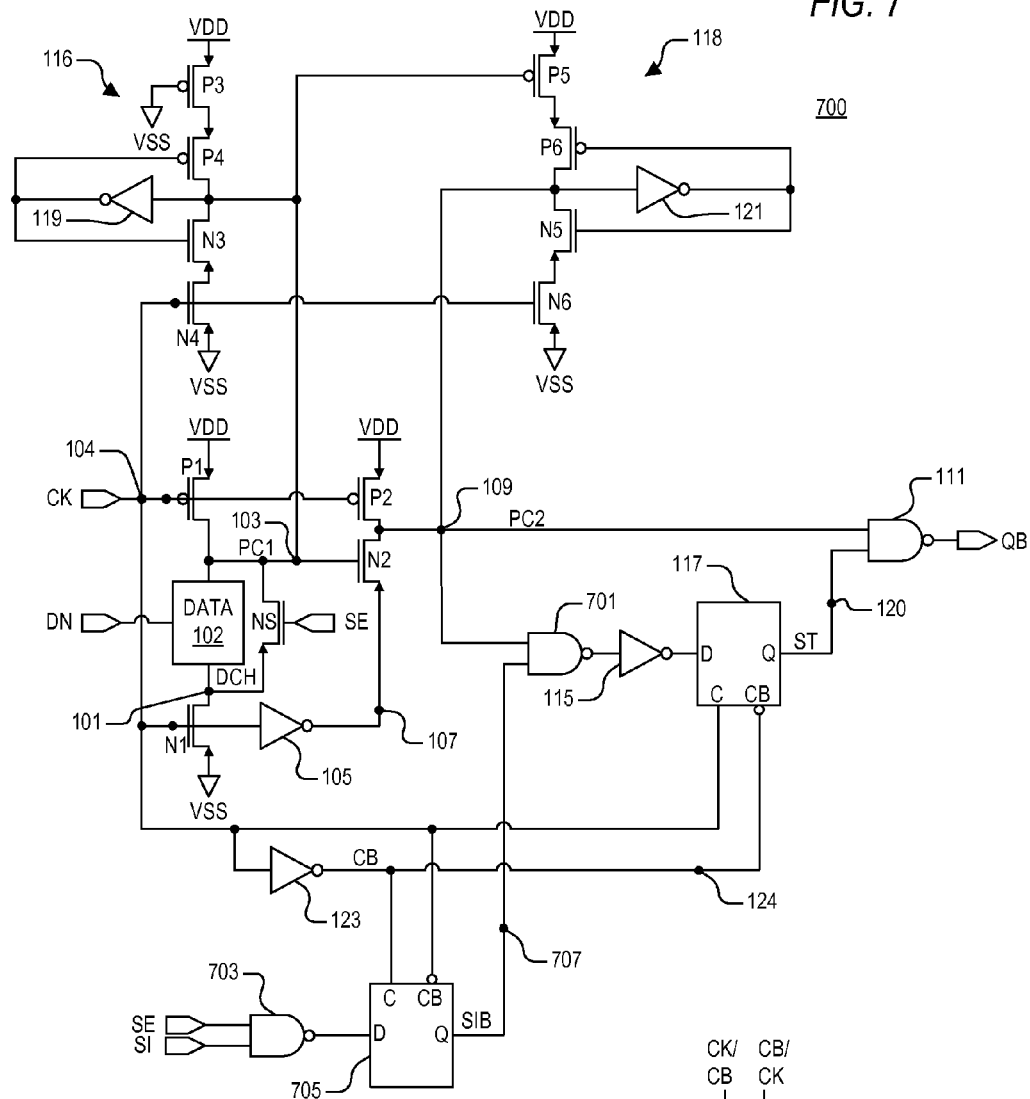
FIG. 7 is a schematic diagram of a scannable fast dynamic register implemented according to one embodiment.

FIG. 7 is a schematic diagram of a scannable fast dynamic register 700 implemented according to one embodiment. The scannable fast dynamic register 700 includes the same components which assume identical reference numbers except that the inverter 113 is replaced by a NAND gate 701. The PC2 node 109 is coupled to one input of the NAND gate 701. The NAND gate 701 provides an additional input for scan operation for injecting scan input data as further described below. The scannable fast dynamic register 700 includes an additional N-channel transistor NS, which is coupled in parallel with the data block 102. In particular, the drain of NS is coupled to the PC1 node 103, its source is coupled to the DCH node 101, and its gate receives a scan enable signal SE. NS may be implemented as a single transistor with sufficient size to pull PC1 to DCH when CK goes high, or may be implemented as multiple transistors in parallel. The input data block 102 and NS collectively form a data and scan enable circuit.

The scannable fast dynamic register 700 further includes another NAND gate 703 having a first input receiving the SE signal, another input receiving a scan in signal SI, and an output coupled to the data input D of another latch 705. The NAND gate 703 implements scan enable logic for enabling and receiving scan input data. The latch 705 is configured in substantially similar manner as the latch 117, and may also be implemented as the latch 600. The latch 705 includes a non-inverted clock input coupled to node 124 for receiving the inverted clock signal CB, an inverted clock input CB coupled to node 104 for receiving the non-inverted clock signal CK, and an output providing an inverted scan input signal SIB on a scan data node 707. The scan data node 707 is coupled to provide SIB to the other input of the NAND gate 701.

When the scan enable signal SE is negated low, then NS remains off and the output of the NAND gate 703 is asserted high. The latch 705 asserts SIB high, so that the NAND gate 701 effectively operates in the same manner as the inverter 113 it replaced. In this manner, when the scan enable signal SE is negated low, then the scannable fast dynamic register 700 operates in the same manner as the fast dynamic register 100 for normal operation.

The dynamic nature of the scannable fast dynamic register 700 is somewhat bypassed during a scan mode when SE is asserted high to enable injection of scan input data. It is noted that the dynamic nature is not completely bypassed since in scan mode, the node PC1 103 discharges for each CK cycle. When SE is high, the gate of NS is pulled high so that NS is turned on when CK goes high providing a current path from the node PC1 103 through N1. The data block 102, therefore, is shorted or otherwise bypassed. Regardless of the state(s) of the one or more data inputs DN, NS turned on by SE simulates evaluation so that the PC1 node 103 is pulled low when CK goes high and continues to precharge high when CK goes back low. The PC2 node 109 remains high during successive cycles of CK, so that the state of the NAND gate 701 is determined by SIB and the state of the NAND gate 111 is determined by ST.

When SE is asserted high, the NAND gate 703 operates as an inverter of the input scan input signal SI. When CK is low during scan mode, the latch 705 is in transparent mode so that the SI signal passes inverted as the SIB signal to the NAND gate 701 and thus to the D input of the latch 117. The latch 117 is in isolation mode while CK is low. When CK goes high, SIB is held at its current value by the latch 705 and is passed as the ST value by the latch 117 now in transparent mode. In this manner, the latches 705 and 117 collectively operate in a similar manner as a master-slave flip-flop to latch the scan input SI into the register 700 during successive cycles of CK.

It is appreciated that the NAND gate 701 operates as a select circuit depending upon the mode of operation providing a selected output. During the normal mode when SE is de-asserted low, SIB remains high so that the NAND gate 701 effectively inverts the state of the PC2 node 109 as its output. The inverter 115 re-inverts the state provided to the D input of the latch 117. During the scan mode when SE is asserted high, the PC2 node 109 remains high so that the NAND gate 701 effectively inverts the state of SIB at its output. Again, the inverter 115 re-inverts the state provided to the D input of the latch 117. Thus, the NAND gate 701 enables injection of scan input data during the scan mode when SE is asserted.

Figure 8:
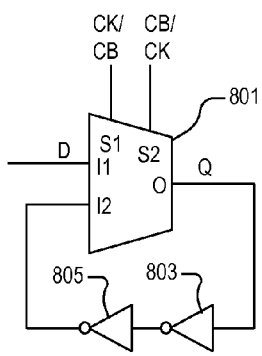
FIG. 8 is a schematic diagram of an alternative embodiment of either or both of the transparent latches of FIG. 7 using a multiplexer.

FIG. 8 is a schematic diagram of an alternative embodiment of either or both of the transparent latches 117 and 705, which generally operate as store circuits. Either or both of the transparent latches are replaced by a multiplexer (MUX) 801 and a pair of inverters 803 and 805. The MUX 801 has a first input I1 which operates in similar manner as the "D" input of the transparent latch, and has an output (O) which operates in similar manner as the "Q" output of the transparent latch. The MUX 801 further has a pair of select inputs S1 and S2, each receiving either CK or CB depending upon whether replacing latch 117 or latch 705. The output of the MUX 801 is provided to the input of the inverter 803, having its output provided to the input of inverter 805, having its output provided to a second input I2 of the MUX 801.

In operation, when the clock signals CK and CB have states such that the MUX 801 selects the input I1 as the output O, then the MUX 801 operates in its "transparent" state in which data input D is provided as the data Q output. When the clock signals are reversed such that the MUX 801 selects the input I2 as the output O, then the MUX 801 operates in its isolation state in which the state of the output Q is effectively "latched" regardless of changes of the D input.

When replacing the latch 117, the output of the inverter 115 is provided to input I1 of the MUX 801, the output of the MUX 801 provides the ST signal on the store node 120, CK is provided to the 51 select input of the MUX 801, and CB is provided to the S2 select input of the MUX 801. When replacing the latch 705, the output of the NAND gate 703 is provided to input I1 of the MUX 801, the output of the MUX 801 provides the SIB signal on the scan data node 707, CK is provided to the S2 select input of the MUX 801, and CB is provided to the S1 select input of the MUX 801.

Figure 9:
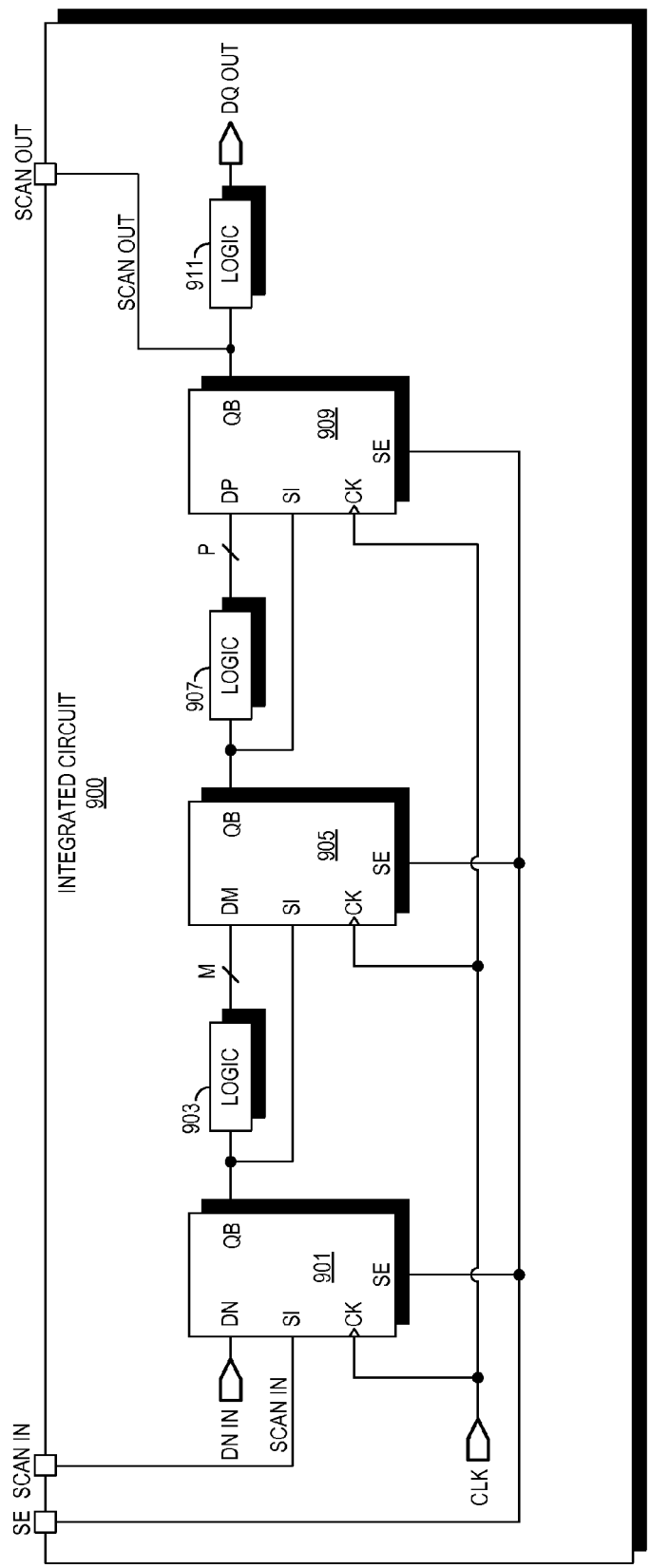
FIG. 9 is a block and schematic diagram of an integrated circuit incorporating scannable fast dynamic registers each implemented according to the scannable fast dynamic register of FIG. 7.

FIG. 9 is a block and schematic diagram of an integrated circuit (IC) 900 incorporating scannable fast dynamic registers 901, 905, and 909 each implemented according to the scannable fast dynamic register 700. Although three of the scannable fast dynamic registers 901, 905, and 909 are shown, it is understood that any number of registers may be incorporated on an IC based on the particular implementation. Also, each of the scannable fast dynamic registers 901, 905, and 909 are shown for receiving different numbers of input data and outputting one data bit, where it is understood that multiple registers may be provided in parallel to simultaneously store any number of bits depending upon the size of the register as understood by those of ordinary skill in the art.

One or more data inputs DN IN are provided to the data or "DN" inputs of the scannable fast dynamic register 901, having an output QB provided to a combinatorial logic circuit 903. N is any suitable integer greater than 0 and may be a single data bit as previously described. The combinatorial logic circuit 903 has a number "M" outputs provided to the DM IN inputs of the scannable fast dynamic register 905, having an output QB provided to a combinatorial logic circuit 907. M is any suitable integer greater than 0 and may be a single data bit as previously described. P outputs of the combinatorial logic circuit 907 are provided to the DP IN inputs of the scannable fast dynamic register 909, having an output QB provided to a combinatorial logic circuit 911, having an output providing Q data outputs DQ OUT. P and Q are each any suitable integer greater than 0, and either one may be a single data bit as previously described. A clock signal CLK is provided to the clock inputs of each of the scannable fast dynamic registers 901, 905, and 909.

The scan enable signal SE is provided from an external source via an IC pin as illustrated. SE is provided to the SE enable inputs of each of the scannable fast dynamic registers 901, 905, and 909. An input scan signal SCAN IN is provided to a scan input SI of the scannable fast dynamic register 901. SCAN IN may be provided from an external IC pin as illustrated. The QB output of the scannable fast dynamic register 901 is provided to the SI input of the scannable fast dynamic register 905, having its QB output provided to the SI input of the scannable fast dynamic register 909. The QB output of the scannable fast dynamic register 909 provides an output scan signal SCAN OUT. The SCAN OUT signal is provided externally via an IC pin as illustrated.

During normal operation, SE is pulled low effectively disabling the SI inputs of the scannable fast dynamic registers 901, 905, and 909. DN IN may be generated on the IC 100 or provided from an external source via a corresponding IC pin or the like. The registers 901, 905, and 909 and the combinatorial logic circuits 903, 907 and 911 perform at least one function of the IC 100 during normal operation. DQ OUT may be provided to another on-chip device or may be provided to an external device via a corresponding IC pin or the like. Each of the combinatorial logic circuits 903, 907 and 911 incorporate combinatorial logic or the like and the scannable fast dynamic registers 901, 905, and 909 save the state of the circuitry during each cycle of CLK as understood by those of ordinary skill in the art.

Scan capability is provided for test purposes to functionally test operation of the IC 100. During a scan mode, SE is asserted high effectively disabling the data inputs DN and enabling each of the SI inputs of each of the scannable fast dynamic registers 901, 905, and 909. In this manner, the scannable fast dynamic registers 901, 905, and 909 are daisy-chained in serial fashion between SCAN IN and SCAN OUT during scan mode. A test vector or the like is provided via the SCAN IN input and clocked via CLK to load the scannable fast dynamic registers 901, 905, and 909 with a test vector value. SE is temporarily pulled low and the IC 100 operates for one or more CLK cycles depending upon the particular test function. Then SE is then pulled high and the information stored in the scannable fast dynamic registers 901, 905, and 909 is output via SCAN OUT during successive cycles of CLK. The output test vector is then examined to determine the test results.

At least one benefit of the configuration of the scannable fast dynamic register 700 is that the pathway of the scan data to the output is static and partially bypasses the dynamic features of the register to enable injection of scan input data. A significant benefit is to minimize the interaction of scan circuitry with the dynamic circuitry while retaining the initial fast-speed features for non-scan operation. The fast register shown and described herein incorporates a simple function of inverting one or more data inputs DN to register a single output QB. Many other logic functions, including more sophisticated functions, may be built into the fast register. The method of scan insertion shown herein may be employed in similar fashion to other registers incorporating much more complicated functions.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same purposes of the present invention without departing from the spirit and scope of the invention.

What is claimed is:

1. A scannable fast dynamic register, comprising:
   a data and scan enable circuit coupled between a first precharge node and a discharge node and receiving at least one data input and a scan enable input, wherein said data and scan enable circuit pulls said first precharge node to said discharge node when a clock node transitions from a first clock state to a second clock state and either when said data block evaluates or when said scan enable input is asserted, but otherwise does not pull said first precharge node to said discharge node;
   a precharge circuit that precharges both a second precharge node and said first precharge node high while said clock node is in said first clock state, that releases said first precharge node and pulls said discharge node low when said clock node transitions to said second clock state, and that discharges said second precharge node low when said first precharge node remains high after said clock node transitions to said second clock state;

a select circuit having a first input coupled to said second precharge node, having a second input coupled to a scan data node, and having a selected output;

a store circuit having a store input receiving said selected output and having an output coupled to a store node, wherein said store circuit passes a state of said selected output to said store node while said clock node is in said second clock state, and wherein said store circuit holds a last state of said store node when said clock node is in said first clock state;

a scan input enable circuit that passes a state of a scan input to said scan data node when said scan enable input is asserted and when said clock node is in said first clock state, that forces said scan data node high when said scan enable signal is de-asserted and when said clock node is in said first clock state, and that holds a last state of said scan data node when said clock node is at said second clock state; and an output logic gate that drives an output node to a state based on states of said second precharge node and said store node.

2. The scannable fast dynamic register of claim 1, wherein said data and scan enable circuit comprises:
   a data block coupled between said first precharge node and said discharge node and receiving said at least one data input; and
   a scan enable circuit coupled between said first precharge node and said discharge node and receiving said scan enable input.

3. The scannable fast dynamic register of claim 2, wherein said scan enable circuit comprises at least one N-channel transistor having a first current terminal coupled to said first precharge node, having a second current terminal coupled to said discharge node, and having a control input receiving said scan enable input.

4. The scannable fast dynamic register of claim 2, wherein said data block comprises a plurality of N-channel transistors each controlled by a corresponding one of a plurality of data inputs and coupled together to perform a predetermined logic function.

5. The scannable fast dynamic register of claim 1, wherein said select circuit comprises an AND-type logic gate.

6. The scannable fast dynamic register of claim 1, wherein said store circuit comprises a transparent latch having a latch input receiving said selected output and having a latch output coupled to said store node.

7. The scannable fast dynamic register of claim 6, further comprising:
   an inverter having an input coupled to said clock node and an output coupled to an inverting clock node; and
   wherein said transparent latch comprises first and second transistors each having a pair of current terminals coupled between said latch input and said latch output, wherein said first transistor has a control input coupled to said clock node, and wherein said second transistor has a control input coupled to said inverting clock node.

8. The scannable fast dynamic register of claim 1, wherein said scan input enable circuit comprises:
   scan enable logic having a first input receiving said scan enable input, having a second input receiving said scan input, and having an output; and
   a second store circuit having a store input coupled to said output of said scan enable logic and having an output coupled to said scan data node, wherein second store circuit passes a state of said scan input to said scan data node while said clock node is in said first clock state, and wherein said second store circuit holds a last state of said scan data node when said clock node is in said second clock state.

9. The scannable fast dynamic register of claim 8, wherein said second store circuit comprises a transparent latch having a latch input coupled to said output of said scan enable logic and having a latch output coupled to said scan data node.

10. The scannable fast dynamic register of claim 9, further comprising:
    an inverter having an input coupled to said clock node and an output coupled to an inverting clock node; and
    wherein said transparent latch comprises first and second transistors each having a pair of current terminals coupled between said latch input and said latch output, wherein said first transistor has a control input coupled to said clock node, and wherein said second transistor has a control input coupled to said inverting clock node.

11. An integrated circuit, comprising:
    a clock node and a scan enable node, wherein said scan enable node receives a scan enable signal indicative of a scan mode; and
    at least one scannable fast dynamic register, each comprising:
       a data and scan enable circuit coupled between a first precharge node and a discharge node and receiving at least one data input and having a scan enable input receiving said scan enable signal, wherein said data and scan enable circuit pulls said first precharge node to said discharge node when said clock node transitions from a first clock state to a second clock state either when said data block evaluates or when said scan enable signal is asserted, but otherwise does not pull said first precharge node to said discharge node;
       a precharge circuit that precharges both a second precharge node and said first precharge node high while said clock node is in said first clock state, that releases said first precharge node and pulls said discharge node low when said clock node transitions to said second clock state, and that discharges said second precharge node low only if said first precharge node remains high after said clock node transitions to said second clock state;
       a select circuit having a first input coupled to said second precharge node, having a second input coupled to a scan data node, and having a selected output;
       a store circuit having a store input receiving said selected output and having an output coupled to a store node, wherein said store circuit passes a state of said selected output to said store node while said clock node is in said second clock state, and wherein said store circuit holds a last state of said store node when said clock node is in said first clock state;
       a scan input enable circuit that passes a state of a scan input to said scan data node when said scan enable input is asserted and when said clock node is in said first clock state, that forces said scan data node high when said scan enable signal is de-asserted and when said clock node is in said first clock state, and that holds a last state of said scan data node when said clock node is at said second clock state; and
       an output logic gate that drives an output node to a state based on states of said second precharge node and said store node.

12. The integrated circuit of claim 11, further comprising:
    a scan in node and a scan out node;

wherein said at least one scannable fast dynamic register comprises a plurality of scannable fast dynamic registers;

wherein a scan input of a first one of said plurality of scannable fast dynamic registers is coupled to said scan in node;

wherein a scan input of a last one of said plurality of scannable fast dynamic registers is coupled to an output node of a previous one of said plurality of scannable fast dynamic registers; and wherein an output node of said last one of said plurality of scannable fast dynamic registers is coupled to said scan out node.

13. The integrated circuit of claim 12, further comprising at least one combinatorial logic block, each having an input coupled to an output node of a prior one of said plurality of scannable fast dynamic registers, and each having at least one output coupled to corresponding ones of at least one data input of a next one of said plurality of scannable fast dynamic registers.

14. The integrated circuit of claim 11, wherein said data and scan enable circuit comprises a scan enable circuit coupled between said first precharge node and said discharge node and coupled to said scan enable node.

15. The integrated circuit of claim of claim 14, wherein said scan enable circuit comprises at least one N-channel transistor having a first current terminal coupled to said first precharge node, having a second current terminal coupled to said discharge node, and having a control input coupled to said scan enable node.

16. The integrated circuit of claim 11, wherein said select circuit comprises an AND-type logic gate.

17. The integrated circuit of claim 11, wherein said scan input enable circuit comprises:
   scan enable logic having a first input coupled to said scan enable node, having a second input receiving said scan input, and having an output; and
   a second store circuit having a store input coupled to said output of said scan enable logic and having an output coupled to said scan data node, wherein said second store circuit passes a state of said scan input to said scan data node while said clock node is in said first clock state, and wherein said second store circuit holds a last state of said scan data node when said clock node is in said second clock state.

18. The integrated circuit of claim 17, wherein said second store circuit comprises a transparent latch having a latch input coupled to said output of said scan enable logic and having a latch output coupled to said scan data node.

19. The integrated circuit of claim 18, further comprising:
   an inverter having an input coupled to said clock node and an output coupled to an inverting clock node; and
   wherein said transparent latch comprises first and second transistors each having a pair of current terminals coupled between said latch input and said latch output, wherein said first transistor has a control input coupled to said clock node, and wherein said second transistor has a control input coupled to said inverting clock node.

* * * * *